United States Patent [19]

Wanjura

[11] Patent Number: 5,014,026

[45] Date of Patent: May 7, 1991

[54] FILTER DEVICE

[75] Inventor: Franz E. G. Wanjura, Kungskängen, Sweden

[73] Assignee: Telefonaktiebolaget L M Ericsson, Stockholm, Sweden

[21] Appl. No.: 484,808

[22] Filed: Feb. 26, 1990

[30] Foreign Application Priority Data

Mar. 13, 1989 [SE] Sweden .................................. 8900882

[51] Int. Cl.$^5$ .............................................. H03H 7/00
[52] U.S. Cl. ...................................... 333/185; 333/12; 333/184
[58] Field of Search ................... 333/12, 167, 177, 184, 333/185, 181; 361/321; 336/200, 206, 232

[56] References Cited

U.S. PATENT DOCUMENTS

| 4,322,698 | 3/1982 | Takahashi et al. | 333/184 |
| 4,571,561 | 2/1986 | Fujiki et al. | 333/184 |
| 4,728,911 | 3/1988 | Sjogran | 333/167 |
| 4,782,310 | 11/1988 | Saburi et al. | 333/185 X |
| 4,791,391 | 12/1988 | Linnell et al. | 333/184 |
| 4,904,967 | 2/1990 | Morii et al. | 333/185 |
| 4,918,417 | 4/1990 | Sakamoto | 336/200 X |

FOREIGN PATENT DOCUMENTS 2329418  1/1975  Fed. Rep. of Germany .

Primary Examiner—Eugene R. LaRoche
Assistant Examiner—Seung Ham
Attorney, Agent, or Firm—Burns, Doane, Swecker & Mathis

[57] ABSTRACT

The present invention relates to a filter device for suppressing radio-frequency interferences on a plurality of pairs of transmission lines. The device includes a filter function for each pair of transmission lines. The filter function comprises an inductance in series with a respective transmission line of the transmission-line pair, and a capacitance connected between this line and around. In accordance with the invention, the filter functions are constructed, one upon the other, on a carrier (1) which includes along two mutually opposing sides (2a, 2b) rows of connector pins (3a, 3b) for the various pairs of transmission lines. Each filter facility includes two pairs of capacitor layers (7a, 7b, 14a, 14b) with intermediate insulation (8, 15), and two inductance layers (9, 13) having conductive paths (17, 19) with intermediate ferrite layers (11). The one capacitor layer (7a, 14a) of each pair is connected to respective connector pins (3a or 3b) for the associated pair of transmission lines, and the other capacitor layer (17b, 14b) is connected to a ground pin. The conductive paths (17, 19) of the two conductance layers (9, 13) together form the inductances associated with the transmission-line pair and are connected to respective pins (3a, 3b) for this transmission-line pair. The various layers are mutually superimposed on the carrier (1) between the opposing rows connector pins (3a, 3b).

11 Claims, 3 Drawing Sheets

FILTER DEVICE

TECHNICAL FIELD

The present invention relates to a filter device for suppressing radio-frequency interferences on a plurality of pairs of transmission lines, said filter device including for each pair of transmission lines a filter facility which comprises an inductance in series with a respective transmission line of said pair of transmission lines and a capacitance which is connected between said transmission line and earth.

BACKGROUND ART

Electronic equipment belonging to modern telephone and data transmission systems is often mounted in metallic apparatus-cabinets which are effective to screen electromagnetic fields. The intention is, in part, to screen the equipment housed in the cabinet from the effect of external electromagnetic fields, and also to screen the surroundings from undesirable electromagnetic fields generated by the equipment in the cabinet. However, since the transmission lines are able to function as antennas, outside and inside the cabinet, radio-frequency interferences can, nevertheless, be transmitted from the outside to the inside of the cabinet, and vice versa, through these transmission lines. The effect of such interferences diminishes when the transmission lines are connected in series with filters which, while operative to dampen undesirable interferences, will permit the transmission of desired utility signals.

Utility signals occur as so-called symmetrical signals in twin-conductor lines and under certain conditions will remain unaffected, or at least substantially unaffected, by the presence of a filter. This is because the magnetic fields generated in the coils by these signals can be caused to cancel out each other, to a substantial extent. On the other hand, undesirable interference signals, which have been induced in both conductors and which consequently behave as so-called asymmetric signals, are dampened effectively under the same conditions. A relatively low limit frequency for assymetric interference signals can be obtained by appropriate configuration of the filter.

It is known, to this end, to use filters which include coils. One drawback with filters of this design, however, is that they are bulky and heavy, primarily because the coils comprise a conducting wire which is wound around a coil body, and the coils will often include an iron core. Consequently, a filter device which is intended for a plurality of transmission-line pairs and which includes a corresponding number of filters of the aforesaid kind will demand a large amount of space in which to accommodate the coils required, and will also be heavy and difficult to handle.

DISCLOSURE OF INVENTION

The object of the present invention is to provide a small, light and readily handled filter device or assembly of the aforesaid kind which can be mounted, e.g., in an appropriate cabinet. This object is achieved with a filter device having the characteristic features set forth in the following claims.

Several advantages are afforded when the various filter facilities are constructed in layers, with the aid of thick-film techniques, for instance. One advantage is that the filter device will only take-up a small amount of space, since the requisite coils and any iron cores provided can be configured in the form of thin layers. Another advantage is that this technique enables several filter facilities to be constructed one upon the other, so that the space taken-up by a filter device intended for several pairs of transmission lines will only be negligibly larger than the space taken-up by a filter device which is intended for solely one pair of transmission lines.

The invention will now be described in more detail with reference to a preferred, exemplifying embodiment thereof illustrated in the accompanying drawings, further advantages afforded by the invention being made apparent in conjunction therewith.

BEST MODES FOR CARRYING OUT THE INVENTION

Figure 1:
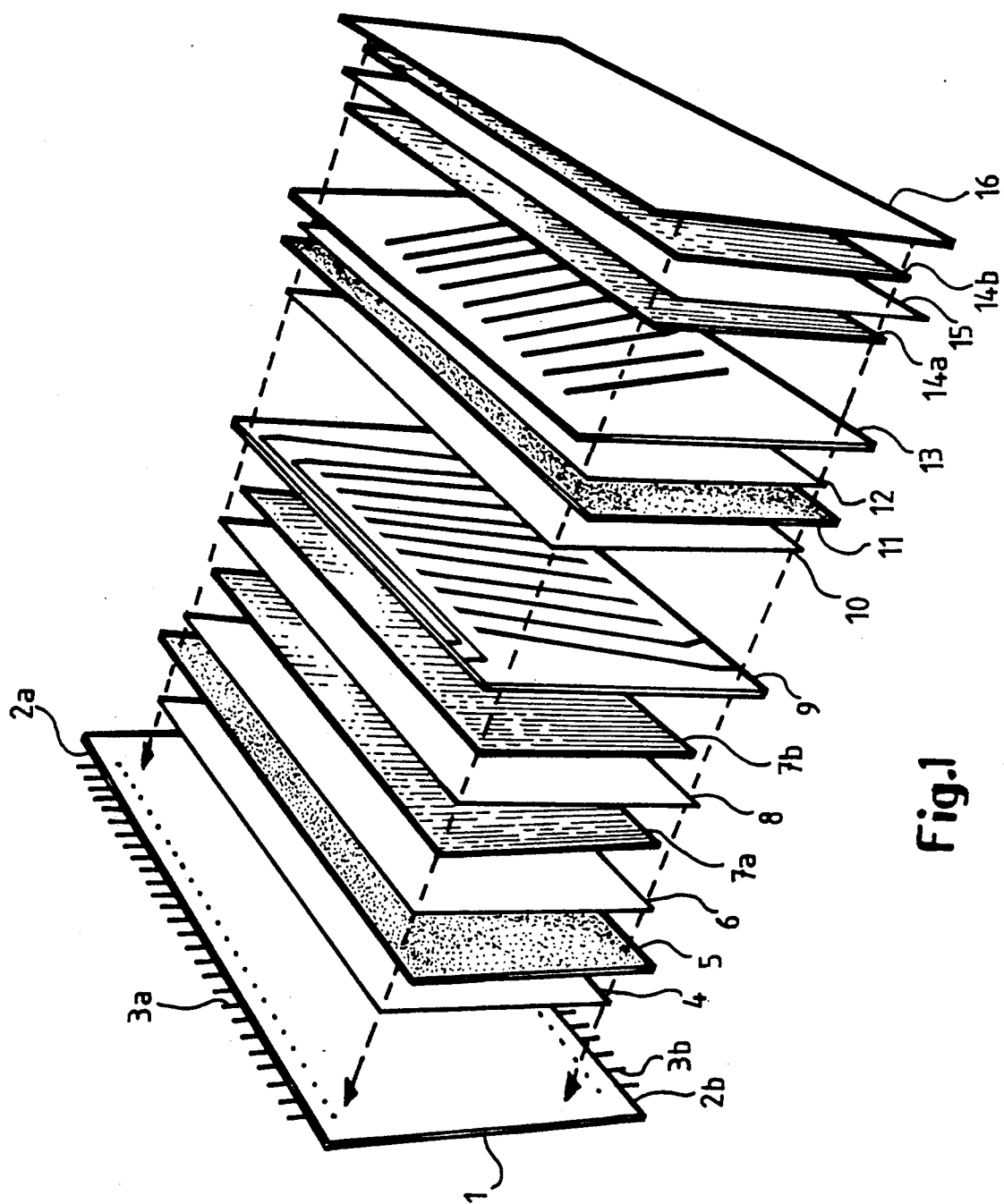
FIG. 1 illustrates schematically and in perspective the construction of a first filter facility on a carrier.

FIG. 1 illustrates schematically the construction of a first filter facility incorporated in an inventive filter device. This filter facility, similar to all of the other filter facilities, comprises an inductance which is in series with a respective transmission line of a pair of transmission lines, and a capacitance which is connected between said line and earth, in accordance with the equivalent circuit illustrated in FIG. 3.

The filter device illustrated in FIG. 1 is constructed on a carrier 1 which, in the present case, has the form of a plate, e.g. a ceramic plate. The carrier 1 is provided along two mutually opposing sides 2a and 2b with rows of connector pins 3a and 3b respectively, for connection of the various pairs of transmission lines. The pins may be disposed in any suitable manner and are connected to standard contact devices, e.g. devices designed in accordance with European standards and having three rows of connector pins, although it will be understood that only that number of connector pins required for the various filter facilities are used and that one or more connector pins are used as earth pins.

The various filter facilities are constructed on the carrier 1 in layers between the rows of connector pins 3a and 3b, e.g. with the aid of thick-film technique.

Starting from the carrier 1, the first filter facility comprises, in sequence, an insulating layer 4, an ferrite layer 5, and a further insulating layer 6. This construction is then followed by a first pair of capacitor layers 7a and 7b with an insulating layer 8 disposed therebetween, such as to form a capacitance in the one transmission line of a pair of transmission lines connected to said first filter facility. One of the capacitor layers, e.g. 7a is connected to one of the connector pins intended for the pair of transmission lines and included in one of the pin-rows 3a or 3b, whereas the second capacitor layer is connected to an earth pin. The capacitor layers are followed by a first inductance layer 9, an insulating layer 10, an ferrite layer 11, a further insulating layer 12 and a second inductance layer 13. The construction and manner of operation of these layers will be explained in more detail here below, with reference to FIG. 2. The filter facility is terminated with a second pair of capacitor layers 14a and 14b and an insulating layer 15 disposed therebetween, and an outermost, terminating insulating layer 16. Similar to the capacitor layers 7a and 7b, the capacitor layers 14a and 14b also form a capacitance, although for the other transmission line of the pair of transmission lines concerned. One of the layers 14a or 14b is connected to the other connector pin intended for said pair of transmission lines and suitably included in the same row of connector pins 3a or 3b as the capacitor layer 7a or 7b, and the other of said layers is connected to an earth pin.

The insulating layer 16 illustrated in FIG. 1 is a terminating layer in the filter facility. The insulating layer is, at the same time, the first layer of the next filter facility, corresponding to the insulating layer 6, this following filter facility being constructed in a manner similar to the first filter facility, with layers corresponding to the layers 614 16. The only difference is that the capacitor layers and the inductance layers are, of course, connected to other connector pins than the connector pins used for the first filter facility.

The construction and modus operandi of the inductance layers 9 and 13 and the intermediate insulating layers 10 and 12 and the ferrite layer 11 will now be described with reference to FIG. 2. The first inductance layer 9 includes rectilinear, mutually parallel pairs of conductive paths 17, as illustrated in full lines in FIG. 2. The conductive paths 17 extend at an angle in relation to the side edges of the layer. The conductive paths 17 of the outermost pair of conductive paths shown to the right in the Figure are connected at one end thereof to connecting paths 18a, which in turn are connected to corresponding connector pins 3a for the associated filter facility. Similarly, the conductive paths 17 of the outermost pair of conductive paths, shown to the left in the Figure, are connected at the opposite end thereof to connecting paths 18b, which are connected to corresponding connector pins 3b.

The insulating layer 10, the ferrite layer 11 and the insulating layer 12 are constructed on the first inductance layer 9 in the manner described above. These layers cover the central parts of the conductive paths 17, but leave the end-points free, as shown in broken lines in FIG. 2. The layers 10 and 12 have the same lateral extension as the inductance layer 9, as do all of the remaining layers in the filter facility with the exception of the ferrite layers 5 and 11. The ferrite layers extend laterally beyond the remaining layers and are there connected together and to the ferrite layers of all other filter facilities, such as to form closed ferrite cores.

Figure 2:
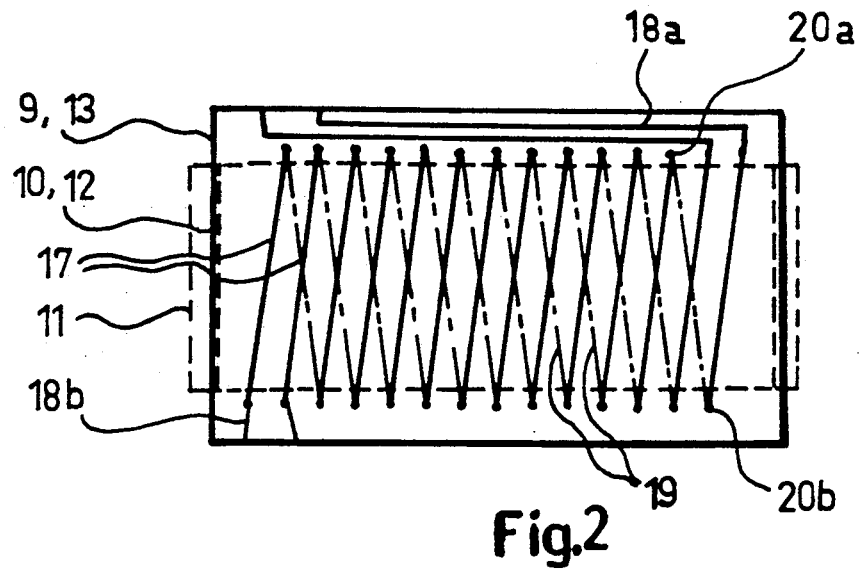
FIG. 2 is a view from above and shows the mutual relationship between the inductance layers included in the filter facility, with intermediate insulating layers and ferrite layers.

Similar to the inductance layer 9, the second inductance layer 13, which is disposed on the insulating layer 12, includes rectilinear, mutually parallel pairs of conductive paths 19, as shown in broken lines in FIG. 2. These conductive paths 19 also extend at an angle relative to the side edges of the layer, but in a direction opposite to the conductive paths 17. The conductive paths 17 and 19 are arranged such that the one end-points 20a of the conductive paths 17 will coincide pairwise with corresponding end-points 20a of the conductive paths 19 and the other end-points 20b of the paths 17 coincide with the end-points 20b of the paths 19. The end-points 20a and 20b are connected together electrically, so as to form a continuous, coherent pair of conductive paths 17, 19 which form the inductances associated with the filter facility concerned. Expressed in another way, the conductive paths 17, 19 constitute a double, "flattened" coil, wherein the intermediate ferrite layer corresponds to the iron core of the coils.

Figure 3:
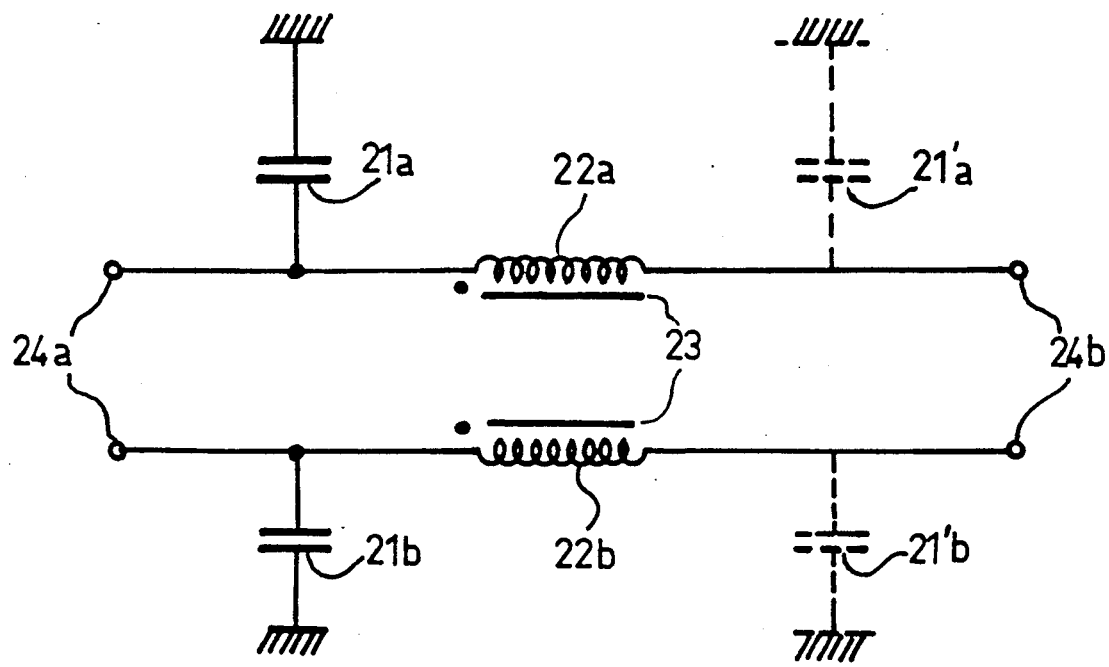
FIG. 3 illustrates an equivalent circuit for a filter facility.

FIG. 3 illustrates the equivalent circuit of the filter facility, said circuit including the capacitances 21a and 21b and the inductances 22a and 22b. The capacitances 21a and 21b have correspondence in the layers 7a, 7b and 14a, 14b respectively in in FIG. 1, and the inductances have correspondence in the layers 9 and 13 with their respective pairs of conductive paths 17 and 19. The iron core 23 of the inductances has correspondence in the ferrite layer 11 and the connections 24a and 24b of the circuit have correspondence in the connector pins 3a and 3b respectively, whereas ground has correspondence in corresponding ground pins. It should be noted that the capacitances 21a and 21b can be arranged on any side of the inductances 22a and 22b, i.e. either connected to the connector pins 3a or the connector pins 3b, as indicated by the capacitances 21'a and 21'b shown in broken lines in FIG. 3. It may be necessary in some instances to provide an extra large capacitance, which is preferably achieved with double capacitances 21a, b and 21'a,b. Additional capacitor layers 7a, b and 14a, b are constructed in this way in the filter facility illustrated in FIG. 1.

Figure 4:
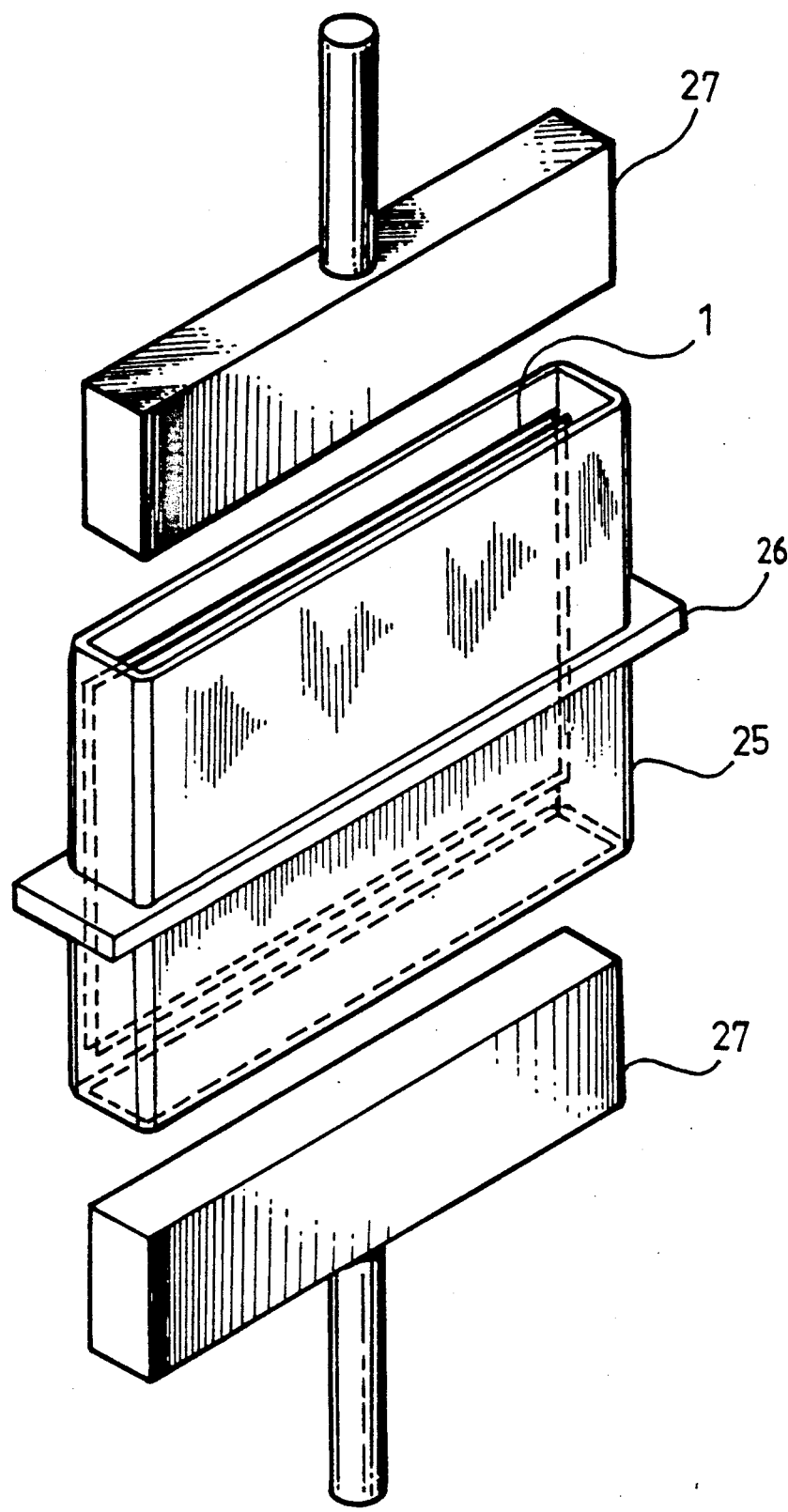
FIG. 4 illustrates in perspective a casing for mounting a filter device in an apparatus cabinet.

FIG. 4 is a schematic illustration of the inventive device mounted in a casing 25 for attachment in an apparatus cabinet. The casing 25 has a box-like configuration, in which the carrier 1 with the filter facilities constructed thereon is mounted. The casing 25 has a flange 26 which is screwed firmly to a wall of an apparatus cabinet, or secured to said wall in some other suitable manner. Connection of the filter device to equipment located within the cabinet and externally of said cabinet is preferably affected with the aid of connector devices 27 capable of being inserted into the ends of the casing 25 and corresponding to the connector devices arranged on the carrier 1 and connected to the connector pins 3a and 3b.

It will be understood that the invention is not restricted to the described and illustrated embodiments and that modifications can be made within the scope of the following claims. For instance, it is possible to exclude certain insulating layers, since the ferrite layers are sufficiently insulating in themselves. The number of filter facilities superimposed in the filter device depends on the number of pairs of transmission lines to be served by said device. The device will normally include 16 filter facilities, i.e. the number of transmission-line pairs present on a subscriber board in a telephone exchange, although a greater or smaller number of filter facilities may be provided.

I claim:

1. A filter device for suppressing radio-frequency interferences on a plurality of pairs of transmission lines, including for each transmission-line pair a filter facility which comprises an inductance arranged in series with a respective line of said transmission-line pair and a capacitance connected between said line and ground, characterized in that a plurality of filter facilities are constructed on a carrier which includes along two mutually opposing sides thereof rows of connector pins for the plurality of pairs of transmissions lines, wherein each filter facility includes two pairs of capacitor layers with intermediate insulation therebetween, one capacitor layer in each pair being connected to a respective connector pin of a pair of transmission lines and the other capacitor layer being connected to a ground pin, and two inductance layers having conductive paths thereon and an intermediate ferrite layer therebetween, said conductive paths in said two inductance layers together forming the inductances arranged in series with the pair of transmission lines, which conductive paths are connected to respective connector pins for said pair of transmission lines, wherein said inductance and capacitor layers are mutually superimposed on the carrier between the opposing rows of connector pins.

2. A filter device according to claim 1, characterized in that an additional ferrite layer is arranged between the carrier and a first filter facility.

3. A filter device according to claim 2, wherein insulating layers are arranged between each of said carrier and said additional ferrite layer, said additional ferrite layer and a first pair of said capacitor layers, a first one of said inductance layer and said intermediate ferrite layer, said intermediate ferrite layer and a second one of said inductance layers, and a second pair of said capacitor layers and a second filter facility.

4. A filter device according to claim 2, characterized in that the two inductance layers are disposed between the two pairs of capacitor layers.

5. A filter device according to claim 1, characterized in that the conductive paths in the two inductance layers have the form of rectilinear, mutually parallel pairs of conductive paths which are disposed so that one end-point of one pair of mutually adjacent conductive paths in one inductance layer will coincide with a corresponding end-point of a pair of mutually adjacent conductive paths in another inductance layer, and so that other end-points of said conductive paths in said other inductance layer will coincide with corresponding end-points of the next pair of conductive paths in the one inductance layer, wherein the intermediate ferrite layer covers the conductive paths but leaves said end-points exposed, so that said conductive paths connects with one another.

6. A filter device according to claim 2, characterized in that the ferrite layers extend on two mutually opposite sides beyond the capacitor and inductance layers and are mutually connected together.

7. A filter device according to claim 1, further including an additional pair of capacitor layers connected in parallel with said two pairs of capacitor layers.

8. A filter device according to claim 1, characterized in that the layers of said filter facilities are constructed using a thick-film technique.

9. A filter device according to claim 1, characterized in that the carrier is a ceramic plate.

10. A filter device according to claim 1, characterized in that the filter device is arranged in a casing which is attached between an inner surface and an outer surface of an apparatus cabinet.

11. A filter device according to claim 3, characterized in that the two inductance layers are disposed between the two pairs of capacitor layers.

* * * * *